United States Patent [19]
Lin et al.

[11] Patent Number: 5,416,786
[45] Date of Patent: May 16, 1995

[54] ERROR CORRECTION CIRCUIT FOR BCH CODEWORDS

[75] Inventors: Yu-Saint Lin, Hsinchu; Yih-Shing Kang, Taipei, both of Taiwan, Prov. of China

[73] Assignee: Industrial Technology Research Institute, Hsinchu, Taiwan, Prov. of China

[21] Appl. No.: 830,668

[22] Filed: Feb. 4, 1992

Related U.S. Application Data

[63] Continuation-in-part of Ser. No. 722,938, Jun. 28, 1991, abandoned.

[51] Int. Cl.$^6$ .............. G06F 11/10; H03M 13/00
[52] U.S. Cl. .................. 371/37.1; 371/37.2; 371/37.7
[58] Field of Search ............ 371/37.1, 37.2, 37.7, 371/38.1, 39.1, 43, 44

[56] References Cited

U.S. PATENT DOCUMENTS

| | | |
|---|---|---|
| 3,983,536 | 9/1976 | Telfer . |
| 4,476,562 | 10/1984 | Sako et al. ............ 371/39.1 |
| 4,502,141 | 2/1985 | Kuki ................. 371/37.1 |
| 4,556,977 | 12/1985 | Olderdissen et al. ...... 371/37.1 |
| 4,608,692 | 8/1986 | Nagumo et al. .......... 371/37.1 |
| 4,751,704 | 6/1988 | Kojima ............... 371/37.1 |
| 5,031,181 | 7/1991 | Sako et al. ............. 371/41 |
| 5,179,560 | 1/1993 | Yamagishi et al. ........ 371/38.1 |

OTHER PUBLICATIONS

Clifford "300 Megabit/Second Benekamp Decoder for Binary BCH Codes " IEEE 91 pp. 775–778.

*Primary Examiner*—Robert W. Beausoliel, Jr.
*Assistant Examiner*—Albert Decady
*Attorney, Agent, or Firm*—Meltzer, Lippe, Goldstein, et al.

[57] ABSTRACT

An error correction circuit for detecting and correcting errors in a received BCH codeword comprises first and second syndrome generators for generating patterns of binary signals representative of first and second syndromes of the received BCH codeword. An error detector circuit utilizes the generated syndromes to determine whether the received codeword has no multi-bit errors. Single bit errors are corrected while multibit errors are only indicated. The single bit error is corrected by successively generating patterns of binary signals representative of the powers $a^k$ of a primitive number a where k=p−1, p−2, . . . 2, 1, 0 and where p is the number of bits in the received codeword. When the binary pattern representative of the first syndrome is identical to the binary pattern representative of $a^k$ for a particular value of k, the particular value k indicates the location of the single bit error in the received codeword.

8 Claims, 5 Drawing Sheets

ERROR CORRECTION CIRCUIT FOR BCH CODEWORDS

RELATED CASE

This is a Continuation-in-part of application Ser. No. 07/722,938 filed on Jun. 28, 1991, now abandoned.

FIELD OF THE INVENTION

The present invention relates to a digital communication system such as a cellular radio communication system which utilizes a BCH (Bose, Chaudhuri, Hocquenghem) code for transmitting data. In particular, the present invention relates to an error correction circuit for detecting and correcting errors in received BCH codewords.

BACKGROUND OF THE INVENTION

With a digital communication system, an error correcting code is generally utilized because the communication system makes use of a channel having a high bit error rate. The BCH code is an example of a code which may be utilized for transmitting data in a digital communication system. (See, e.g., U.S. Pat. No. 4,556,977 and U.S. Pat. No. 4,502,141).

In one example of a BCH code, data is transmitted in codewords which are 40 bits long comprising 28 data bits and 12 error correction bits. At a receiver, an error can be located in any one of the k, k=0, ..., 39 bit positions.

It is a recent trend in the use of BCH codes, as in the above example, that a single bit error is corrected while a t-bit error (t>1) is merely detected without correction, even when the BCH code is such that the correction of double errors is possible. This is because the triple error is often wrongly corrected as the double error despite the fact that the triple error actually occurs.

A conventional BCH error correction circuit receives a succession of BCH code words. The conventional error correction circuit comprises a divider for dividing each codeword by a generator polynomial to obtain a syndrome dependent on the error contained in the codeword and a circuit for determining an error location in each codeword in accordance with the syndrome when the syndrome exhibits occurrence of a single error. The single error is corrected in each codeword. The conventional error checking circuit comprises a read only memory (ROM) as the circuit for determining the error location in each codeword. Such a ROM is programmed in advance to produce an error location signal representative of the error location in the codeword in response to the syndrome. With the conventional error checking circuit, the ROM must have a great memory capacity in order to carry out the above-mentioned operation.

U.S. Pat. No. 4,502,141 describes an improved error correction circuit which requires less memory. This error correction circuit decides whether there is a single or a t-bit error (t being greater than unity) in a received BCH codeword, which codeword was originally derived using a generator polynomial that is factorable into a primitive and a non-primitive polynomial. The error correction circuit comprises first and second dividers for dividing each received codeword by the primitive and non-primitive polynomial, respectively, to provide first and second patterns of binary signals. If the received codeword includes only a single error, the first pattern of binary signals is a residue which specifies a syndrome of the single error. A different pattern of binary signals is produced by the first divider for each possible location of the single bit error in the received codeword. A memory is loaded with reference numbers corresponding to the respective non-zero residues and produces one of the reference numbers only in the presence of a single bit error. A comparator compares the produced reference number with the residue represented by the second pattern of binary signals produced by the second divider to carry out the decision as to whether or not there is in fact a single bit or a multi-bit error in the received codeword. Preferably, the memory is also loaded with the single error bit locations to locate a single bit error in a received codeword.

Thus, in short, the prior art discloses the use of an error correction scheme for BCH codewords which involves calculating one or more syndromes of the received codeword to obtain a single bit error location in the received codeword. A memory device, no matter how small, plays an essential role in the prior art BCH error correction circuits. However, the use of the memory limits the flexibility and increases the complexity of a BCH error correction circuit.

Accordingly, it is an object of the present invention to provide an error correction circuit for received BCH codewords which utilizes no memory.

SUMMARY OF THE INVENTION

As indicated above, the present invention is directed to an error correction circuit for received BCH codewords. Illustratively, each received BCH codeword comprises p bits with q information bits and p−q error correction bits. Illustratively, p=40 and q=28 (shortened type BCH code).

The current received BCH codeword is fed to first and second syndrome generators which produce first and second patterns of binary signals representative of first and second syndromes of the current BCH codeword. Illustratively, the first syndrome is the S1 syndrome which is obtained by dividing the received codeword by the polynomial $1+x+x^6$. Illustratively, the second syndrome is the S3 syndrome which is obtained by dividing the received codeword by the polynomial $1+x+x^2+x^4+x^6$. The outputs of the syndrome generators are fed to an error detection circuit to determine whether there are multiple bit errors. The following two criteria are utilized to determine whether a BCH codeword is contaminated:

criterion #1: S1=S3 criterion #2: $(S1)^3*S3=0$, where the symbol "*" refers to binary addition.

If the criterion #1 is true, then the current received BCH codeword is not a contaminated codeword. If criterion #1 is false, then it means that there are one or more error bits in the received codeword. Then criterion #2 is considered. If criterion #2 is true, it means that there is only one error bit. If criterion #2 is false, there are two or more error bits in the received codeword. The error detection circuit in the present invention is utilized to calculate #2. If it is not true, the received BCH codeword contains more than one error and the error detection circuit will output a signal indicating such a condition.

In the case of a single bit error within a received BCH codeword, the S1 syndrome can be expressed by a polynomial form or by an exponential form of a primitive number a. The exponent is the error location. Thus the error detection circuit includes a multiplier circuit which successively computes $(a)^k, k=p-1, p-2, \ldots, 2, 1, 0$. Each time a value $a^k$ is computed, the pattern of binary signals representative of $a^k$ is compared with the pattern of binary signals representative of polynomial form of the S1 syndrome which is produced by the first syndrome generator.

When the two forms are identical for a particular value of k, the value of k indicates the bit location of the error in the received codeword.

The above-described error correction circuit for a received BCH codeword has a number of significant advantages. First the error detector circuit is simple to implement and requires no memory. In particular, the error correction circuit is easy to implement in VLSI and utilize a minimum of chip area. In addition, the circuit is easy to modify for a shortened BCH code.

DETAILED DESCRIPTION OF THE INVENTION

Figure 1:
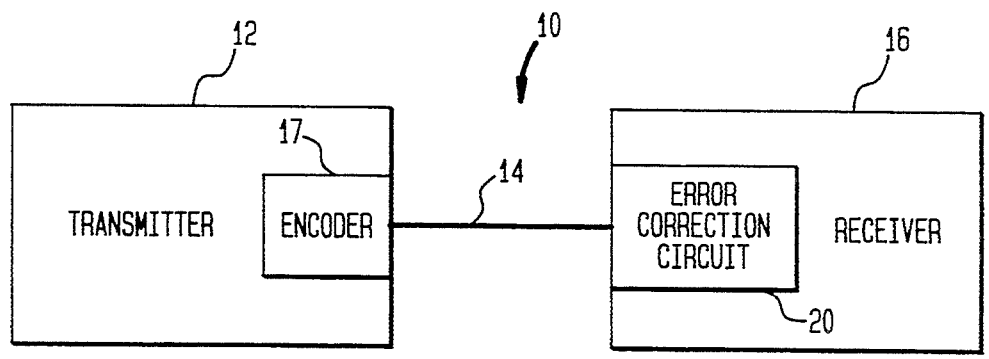
FIG. 1 schematically illustrates a digital communication channel which utilizes a BCH code.

FIG. 1 schematically illustrates a digital telecommunications channel 10. The channel 10 includes a transmitter 12, a communications medium 14, and a receiver 16. The transmitter 12 includes an encoder 17 which encodes data to be transmitted utilizing a BCH code. Illustratively, data is transmitted in codewords comprising p=40 bits wherein q=28 bits (shortened type BCH codeword) are data bits and p−q=12 bits are error correction bits. The BCH codewords are transmitted to the receiver 16 via the communications medium 14. When the receiver 16 receives a BCH codeword, the error correction circuit 20 utilizes the correctly received bits in a codeword to detect and/or correct error in the received codeword.

Figure 2:
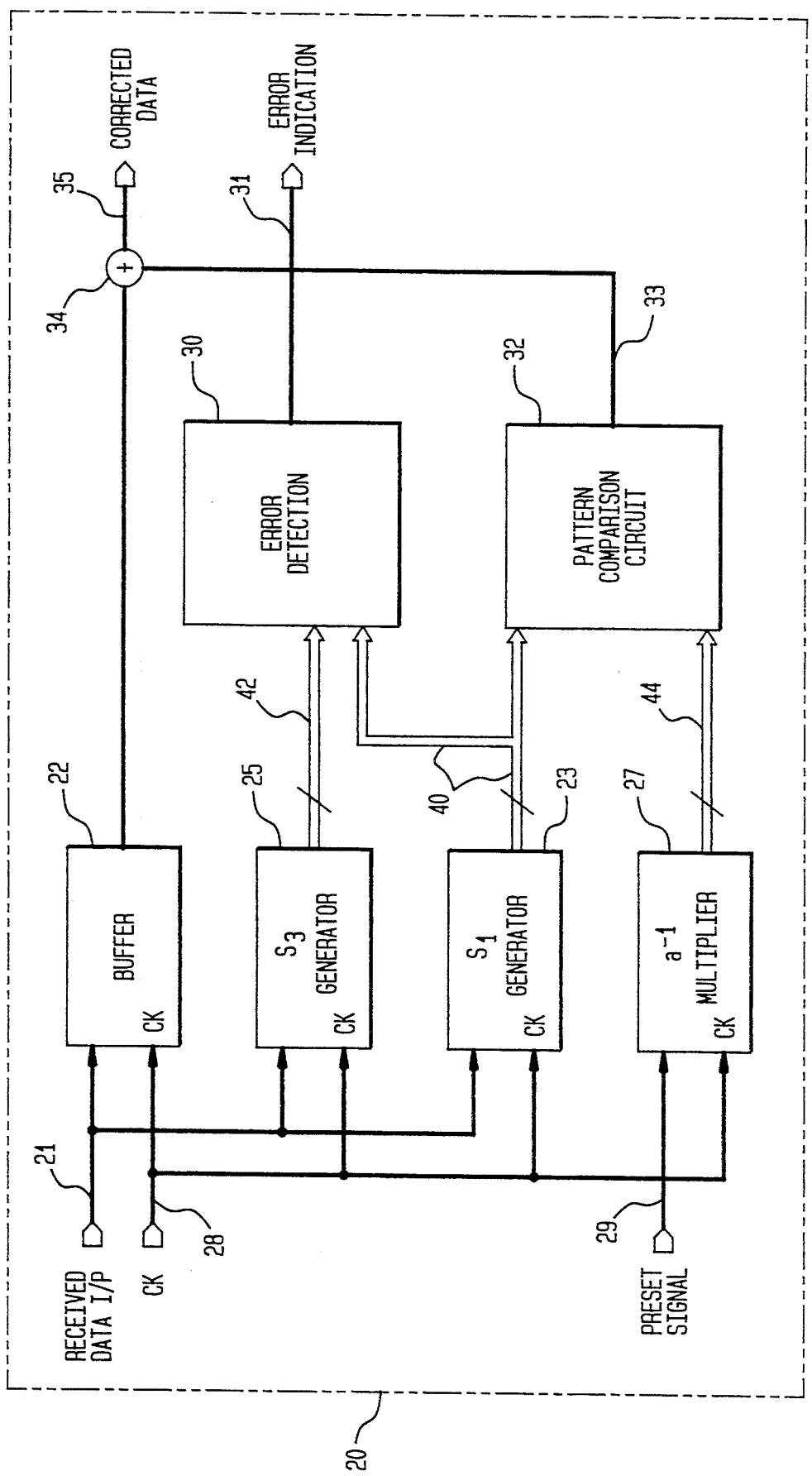
FIG. 2 schematically illustrates an error correction circuit for use with the communication channel of FIG. 1, in accordance with an illustrative embodiment of the present invention.

The error correction circuit 20 is illustrated in greater detail in FIG. 2. A BCH codeword is received at the input 21 and is buffered in the buffer 22. The received codeword is also transmitted to an S1 syndrome generator 23, an S3 syndrome generator 25. A clock signal (ck), which illustratively is a 10 kHz signal, is transmitted from the input 28 to the buffer 22, the S1 generator 23, the S3 generator 25 and the $a^{-1}$ multiplier 27. The $a^{-1}$ multiplier receives a preset signal from the input 29.

The error correction circuit 20 also comprises an error detection circuit 30 and a pattern comparison circuit 32.

A received codeword is buffered in the buffer 22 while the S1 generator 23, the S3 generator 25, the $a^{-1}$ multiplier 27, the error detection circuit 30 and the pattern detection circuit 32 cooperate to detect and/or correct errors in the received codeword. As discussed below, multiple bit errors are detected while single bit errors are both detected and corrected. Indications of multiple bit errors are outputted by the error detection circuit 30. To correct a single bit error, the pattern comparison circuit 32 outputs a signal at the appropriate time on the line 33. This signal is combined with the erroneous bit in the received codeword using the EX-OR gate 34 as the received codeword is being transmitted from the buffer 22 to the output 35. The EX-OR gate 34 corrects an erroneous bit in the codeword by changing a logic 1 to a logic 0 or a logic 0 to a logic 1.

The errors in the received BCH codeword are detected and corrected as follows. The S1 syndrome generator 23 generates a pattern of binary signals on the bus 40 which is representative of the S1 syndrome of the received BCH codeword. The syndrome generator 23 generates the S1 syndrome by dividing the received codeword by the polynomial $1+x+x^6$. The S3 syndrome generator 25 generates a pattern of binary signals on the bus 42 which is representative of the S3 syndrome of the received BCH codeword. The syndrome generator 25 generates the S3 syndrome by dividing the received BCH codeword by the polynomial $1+x+x^2+x^4+x^6$.

Figure 3:
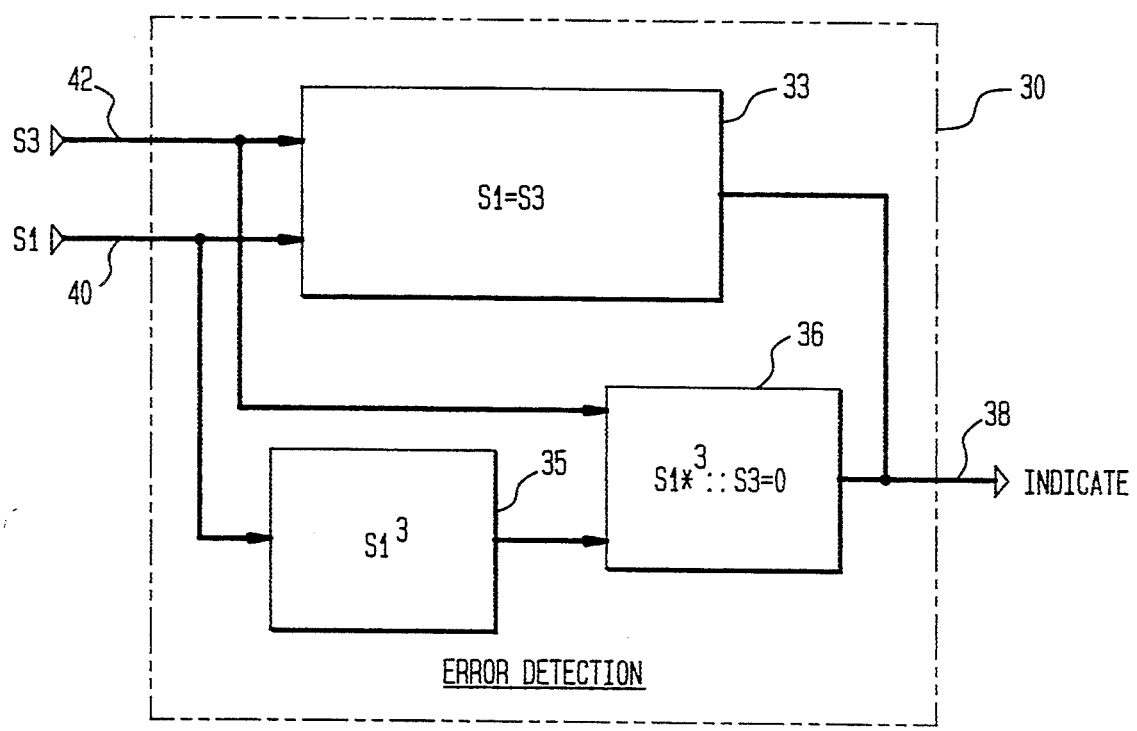
FIG. 3 illustrates an error detection circuit for use in the error correction circuit of FIG. 2.

The S1 syndrome and the S3 syndrome are transmitted to the error detection circuit 30. The error detection circuit 30 is illustrated in greater detail in FIG. 3. The error detection circuit 30 receives the syndromes S1 and S3 via the buses 40 and 42 and outputs an error indication on line 38. The error detection circuit 30 also includes a circuit 35 for outputting a signal representative of $(S1)^3$ and a circuit 36 for outputting a signal indicative of whether or not $(S1)^3*S3=0$. If $(S1)^3*S3=0$ is true, it means that there is only a single bit error or no error in the BCH codeword currently in the buffer 22. On the other hand, if $(S1)^3*S3=0$ is false, it means that there are two or more error bits in the codeword currently in the buffer 22. A signal is output to indicate such a condition.

In the case of a single error in a received BCH codeword, the S1 syndrome can be represented by a pattern of binary signals which correspond to a polynomial. This pattern of binary signals is generated by the S1 syndrome generator 23. The S1 syndrome may also be represented by an exponential form $a^k$ of a primitive number a. When $a^k$ represents the S1 syndrome, the particular value of k indicates the bit position of the single error in the BCH codeword. Thus in the case where the BCH codeword comprises p bits, k can take on the values $p-1, p-2, \ldots 1, 0$. The multiplier 27 successively computes $a^k$ for $k=p-1, p-2, \ldots$ and outputs on the bus 44 of FIG. 1 a pattern of binary signals representative of $a^k$ for each successive value of k For each computation of $a^k$, the pattern comparison circuit 32 compares the pattern of binary signals produced on bus 40 by the S1 syndrome generator 23 with the pattern of binary signals produced by the multiplier 27 on bus 44. When the compared patterns are identical for a specific value of k, this value of k indicates the bit location of a single bit error in the BCH codeword currently in the buffer 22. As the current BCH codeword is transferred from the buffer 22 to the output 35, the pattern comparison in circuit 32 outputs at the appropriate time a signal on line 33 which is added to the erroneous bit by the adder 34 to change a logic 1 to a logic 0 or a logic 0 to a logic 1. More particularly, the buffer 22 and the $a^{-1}$ multiplier 27 are clocked at the same time so that for each clock cycle, one bit of the codeword is shifted out of the buffer and one value of $a^k$ is generated by the multiplier. When the pattern of binary signals produced by the S1 syndrome generator 23 is inconsistent with the pattern of binary signals produced by the $a^{-1}$ multiplier 27, the pattern comparison circuit 32 outputs a logic 0 and the bit transferred out of the buffer is unchanged. When the two patterns are identical, the pattern comparison circuit 32 outputs a logic 1 to change the value of the bit transferred from the buffer.

Figure 4A:
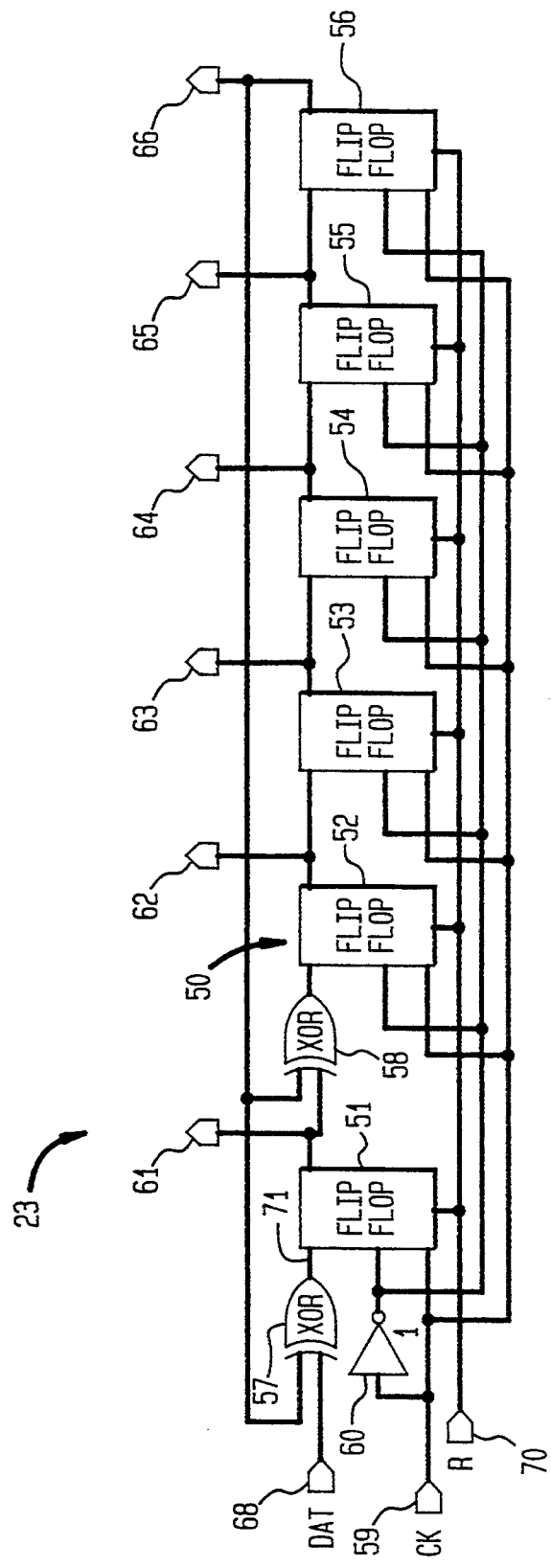
FIG. 4A illustrates a first syndrome generator for use in the error correction circuit of FIG. 2.
Figure 4B:
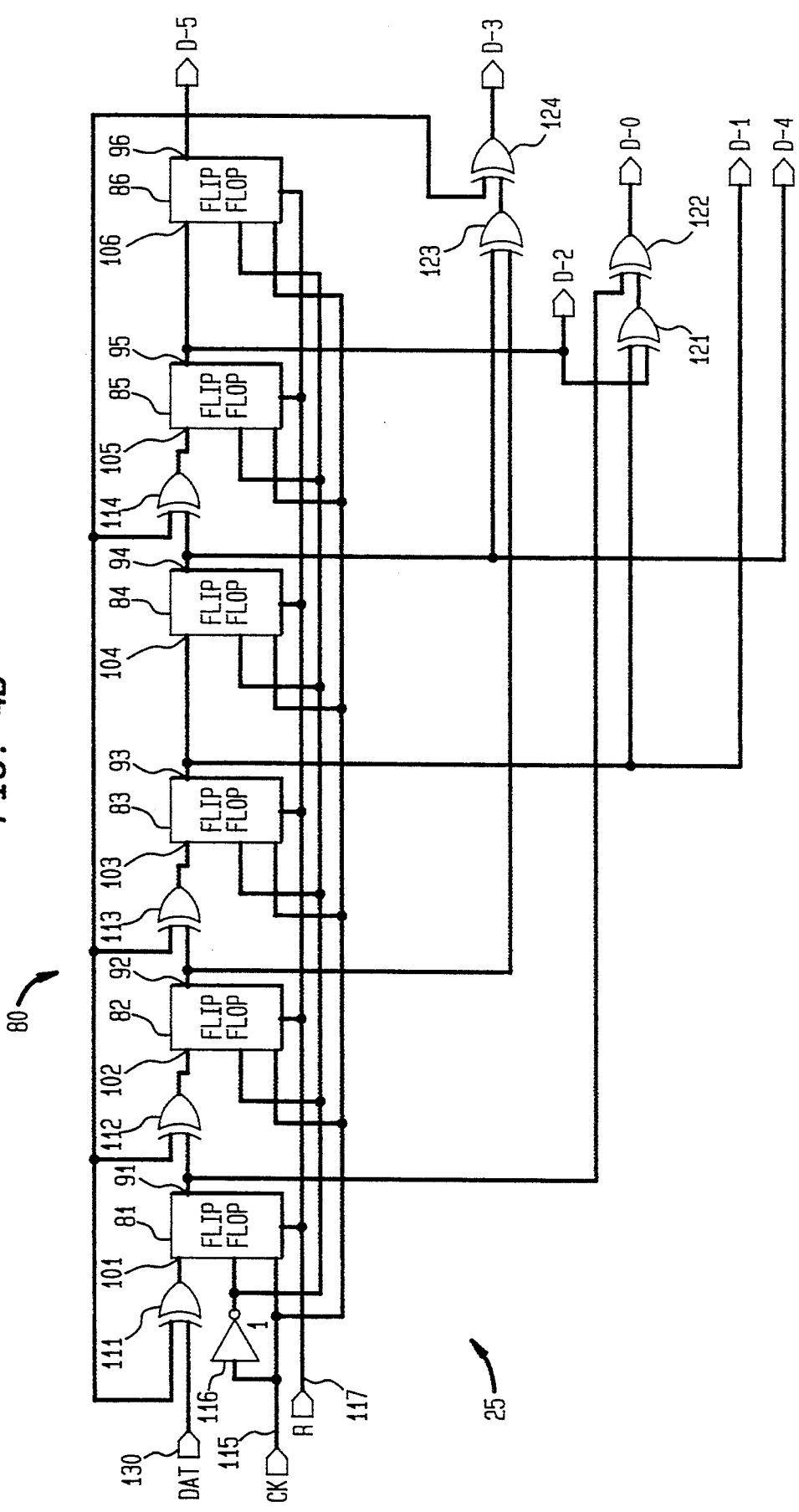
FIG. 4B illustrates a second syndrome generator use in the error correction circuit of FIG. 2.
Figure 5:
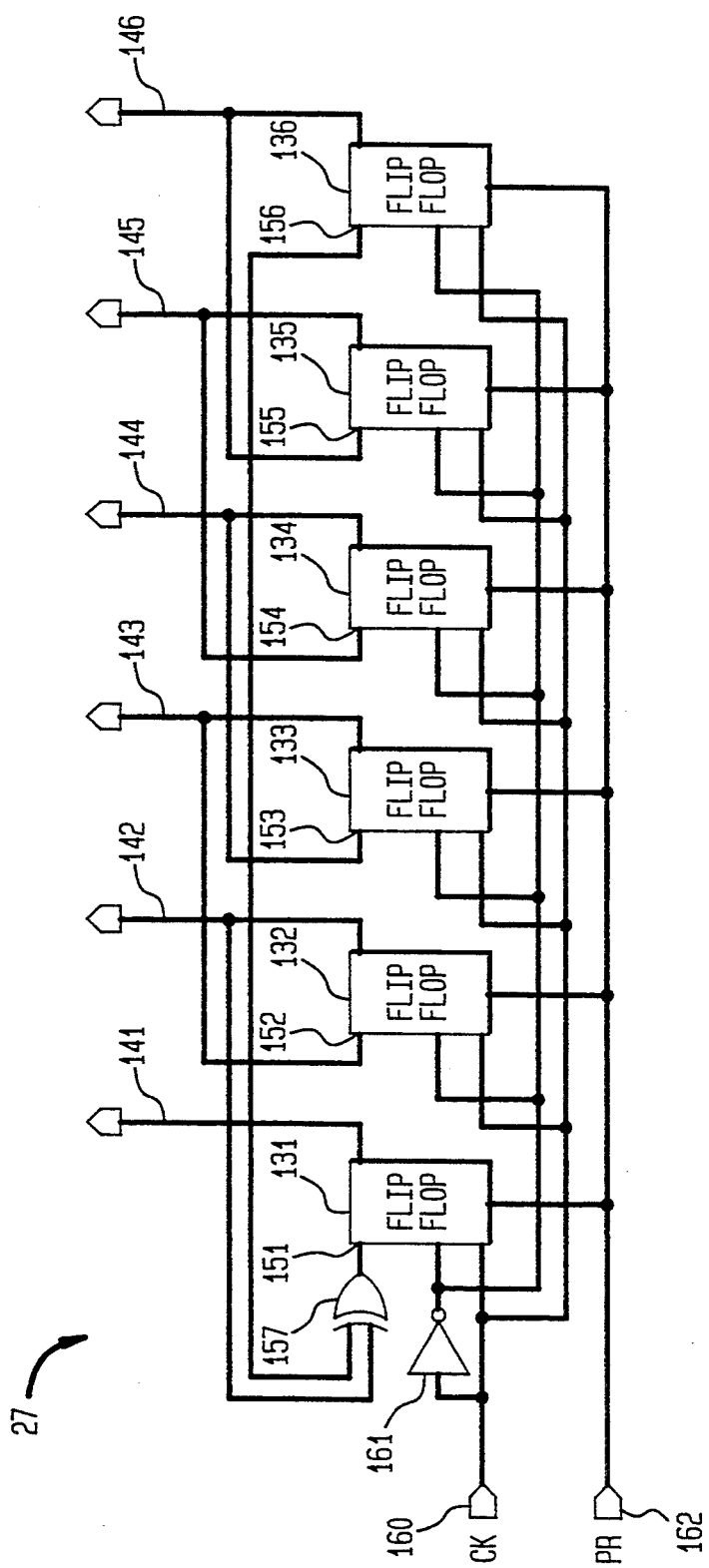
FIG. 5 illustrates an $a^{-1}$ multiplier for use in the error correction circuit of FIG. 2.

The S1 syndrome generator 23, the S3 syndrome generator 25 and the $a^{-1}$ multiplier 27 are illustrated in greater detail in FIGS. 4A, 4B, and 5, respectively.

As shown in FIG. 4A, the S1 generator 23 comprises a feedback register 50 which is formed by the flip-flops 51, 52, 53, 54, 55, 56 and the exclusive OR gates 57 and 58. The flip-flops 51, 52, 53, 54, 55, 56 have outputs labeled 61, 62, 63, 64, 65, 66, respectively. The exclusive OR gate 57 is disposed in a feedback path between the output 66 of the flip-flop 56 and an input 71 of the flip-flop 51. One input of the exclusive OR gate 57 is connected to the output 66 of the flip-flop 56. The second input is discussed below. The output of the exclusive OR gate 57 is connected to the input 71 of the flip-flop 51. The exclusive OR gate 58 has a first input which is connected to the output 66 of the flip-flop 56 and a second input which is connected to the output 61 of the flip-flop 51. The output of the exclusive OR gate 58 is connected to the input 72 of the flip-flop 52. Each of the flip-flops 51–56 receives the clock signal ck and its inverse $\overline{ck}$ via the input 59 and the inverter 60. Each of the flip-flops 51–56 also receives a reset signal R via the input 70. The BCH codeword is received at the register 50 via the input 58 which is connected to the second input of the exclusive OR gate 57. The syndrome generator 23 described above serves to divide this codeword by the polynomial $1+x+x^6$ to produce the syndrome S1 which is represented by the pattern of binary signals finally obtained at the outputs 61–66.

The S3 syndrome generator 25 is shown in greater detail in FIG. 4B. The S3 syndrome generator 25 comprises the feedback register 80. The feedback register 80 comprises the flip-flops 81, 82, 83, 84, 85, 86. The flip-flops 81, 82, 83, 84, 85, 86 have the outputs 91, 92, 93, 94, 95, 96 and the inputs 101, 102, 103, 104, 105, 106. The S3 syndrome generator 25 also includes the exclusive OR gates 111, 112, 113, 114. The gate 111 is disposed between the output 96 of the flip-flop 86 and the input 101 of the flip-flop 91. The gate 112 is disposed between the output 96 of the flip-flop 86 and the input 102 of the flip-flop 82. The gate 113 is disposed between the output 96 of the flip-flop 86 and the input 103 of the flip-flop 83. The gate 114 is disposed between the output 96 of the flip-flop 86 and the input 105 of the flip-flop 85. The flip-flops 81, 82, 83, 84, 85, 86 receives the clock signal ck and its inverse $\overline{ck}$ via the input 115 and the inverter 116. The flip-flops 81–86 also receive a reset signal R via the input 117.

The S3 syndrome generator has six outputs labeled O-0, O-1, O-2, O-3, O-4, O-5. The output O-0 is formed by the exclusive OR gate 121, whose inputs are the output 93 of the flip-flop 83 and the output 95 of the flip-flop 85, and by the exclusive OR gate 122, whose inputs are the output of gate 121 and the output 91 of flip-flop 81. The output O-1 is formed by the output 93 of the flip-flop 83. The output O-2 is formed by the output 95 of the flip-flop 85. The output O-3 is formed by the exclusive or gate 123, whose inputs are the output 94 of the flip-flop 84 and the output 92 of the flip- flop 82, and by the exclusive OR gate 124, whose inputs are the output 96 of the flip-flop 86 and the output of the gate 123. The output O-4 is formed by the output 94 of the flip-flop 84. The output O-5 is formed by the output 96 of the flip-flop 86.

To form the S3 syndrome of a codeword, the codeword is received at the input 130. The syndrome generator 23 divides the codeword in accordance with the polynomial $1+x+x^2+x^4+x^6$. The result is the S3 syndrome which is represented by the pattern of binary signals at the outputs O-0, O-1, O-2, O-3, O-4, O-5.

The $a^{-1}$ multiplier 27 is illustrated in greater detail in FIG. 5. The multiplier 27 comprises the flip-flops 131, 132, 133, 134, 135, 136. The flip-flops 131, 132, 133, 134, 135, 136 have the outputs 141, 142, 143, 144, 145, 146 and the inputs 151, 152, 153, 154, 155, 156. The input 151 of the flip-flop 131 is connected via the exclusive OR gate 57 to the output 142 of the flip-flop 132 and the output 145 of the flip-flop 135. The input 152 of the flip-flop 132 is connected to the output 143 of the flip-flop 133. The input 153 of the flip-flop 133 is connected to the output 144 of the flip-flop 134. The input 154 of the flip-flop 134 is connected to the output 145 of the flip-flop 135. The input 155 of the flip-flop 135 is connected to the output of the 146 of the flip-flop 136. The input 156 of the flip-flop 136 is connected to the output 145 of the flip-flop 135.

The flip-flops 131, 132, 133, 134, 135, 136 receive the clock signal ck and its inverse $\overline{ck}$ via the input 160 and inverter 161.

The $a^{-1}$ multiplier generates in succession the values of $a^k$ as follows. The flip-flops are preset via the preset signal at input 162 and for each cycle of the clock signal, a pattern of binary signals appear at the outputs 141, 142, 143, 144, 145, 146 corresponding to $a^k$ first for $k=p-1$, then $k=p-2$, etc. Illustratively, a is a root of the polynomial $p(x)=1+x+x^6$ and the Galois Field of this case is $GF(2^6)$.

In short, an error correction circuit for detecting and correcting errors in a received BCH codeword has been disclosed. The error correction circuit comprises first and second syndrome generators for generating patterns of binary signals representative of first and second syndromes of the received BCH codeword. An error detector circuit utilizes the generated syndromes to determine whether the received codeword contains no error, a single bit error, or a multi-bit error. Single bit errors are corrected while multi-bit errors are only indicated. A single bit error is corrected by successively generating patterns of binary signals representative of the powers $a^k$ of a primitive number a where $k=p-1$, $p-2, \ldots, 2, 1, 0$ and where p is the number of bits in the codeword. When the binary pattern representative of the first syndrome is identical to the binary pattern representative of $a^k$ for a specific value of k, the specific value of k indicates the location of the single bit error in the received codeword.

Finally, the above-described embodiments of the invention are intended to be illustrative only. Numerous alternative embodiments may be devised by those skilled in the art without departing from the spirit and scope of the following claims.

We claim:

1. An error correction circuit comprising
   receiver circuit which receives a BCH codeword comprising p bits,
   at least one syndrome generator which generates first and second digital signals in the form of binary patterns representative of first and second syndromes of said received codeword, error detection circuit which receives said first and second signals from said syndrome generate a signal indicating if said received codeword includes no error, a single bit error, or a multiple bit error, multiplier circuit which generates successive digital signals in real time in the form of binary patterns representative of exponential forms of $a^k$ of a primitive number where $k=p-1, p-2, \ldots,$ pattern comparator which compares the binary pattern of said first signal and the binary patterns of the signals successively generated by said multiplier circuit to determine a particular value of k for which the compared binary patterns are identical, said particular value of k indicating the bit location of a single bit error in said received codeword, and a correction circuit which receives a signal representative of bit error from said pattern comparator, combines said signal with an erroneous bit of said received BCH codeword and corrects said erroneous bit.

2. The error correction circuit of claim 1, wherein said receiver circuit comprises a buffer.

3. The error correction circuit of claim 1 wherein said syndrome generator comprises a first divider circuit for dividing said received codeword by a first polynomial and a second divider circuit for dividing said received codeword by a second polynomial.

4. The error correction circuit of claim 3 wherein said first polynomial is $1+x+x^6$ and said second polynomial is $1+x+x^2+x^4+x^6$.

5. The circuit of claim 4, wherein said error detection circuit comprises a circuit which determines if $(S1)^3 * S3 = 0$.

6. The circuit of claim 1 wherein said multiplier circuit comprises means for multiplying the exponential form $a^k$ by $a^{-1}$.

7. An error correction circuit comprising receiver circuit which receives a BCH codeword, first generator which generates a pattern of binary signals representative of a syndrome of the received codeword, second generator which generates in real time and in succession patterns of binary signals representative of successive powers of a primitive number, comparator circuit which compares said pattern of binary signals representative of said syndrome with said successively generated patterns of binary signals representative of successive powers of a primitive number to identify a particular pattern of binary signals representative of a particular power of said primitive number that is identical to the pattern of binary signals representative of said syndrome, said particular power indicating the bit location of an error in said received BCH codeword, and a correction circuit which receives a signal representative of bit error from said pattern comparator, combines said signal with an erroneous bit of said received BCH codeword and corrects said erroneous bit.

8. A method for correcting an error in a BCH codeword transmitted via a digital communication comprising the steps of:

first generator electronically generating a pattern of binary signals representative of a syndrome of the BCH codeword, second generator electronically generating in real time and in succession patterns of binary signals representative of successive powers of a primitive number, comparator electronically comparing said pattern of binary signals representative of said syndrome with said successively generated patterns of binary signals representative of successive powers of signals representative of a particular power of said primitive number that is identical to the pattern of binary signals representative of said syndrome, said particular power indicating the bit location of an error in said BCH codeword, and correction circuit electronically combining a signal representative of bit error received from said comparator with an erroneous bit of said BCH codeword to Correct said erroneous bit.

* * * * *